US011226565B2

(12) United States Patent
Yanagida

(10) Patent No.: US 11,226,565 B2
(45) Date of Patent: Jan. 18, 2022

(54) EXTREME ULTRAVIOLET LIGHT GENERATING SYSTEM AND ELECTRONIC DEVICE MANUFACTURING METHOD

(71) Applicant: Gigaphoton Inc., Tochigi (JP)

(72) Inventor: Tatsuya Yanagida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/987,856

(22) Filed: Aug. 7, 2020

(65) Prior Publication Data

US 2020/0363729 A1    Nov. 19, 2020

Related U.S. Application Data

(63) Continuation of application No. PCT/JP2018/012731, filed on Mar. 28, 2018.

(51) Int. Cl.
*G03B 27/54* (2006.01)
*G03F 7/20* (2006.01)
(Continued)

(52) U.S. Cl.
CPC ........ *G03F 7/70033* (2013.01); *G03F 7/7055* (2013.01); *G21K 5/02* (2013.01); *H05G 2/006* (2013.01); *H05G 2/008* (2013.01)

(58) Field of Classification Search
CPC ...... G03F 7/20; G03F 7/70033; G03F 7/7055; G21K 5/02; H05G 2/003; H05G 2/006; H05G 2/008
See application file for complete search history.

(56) References Cited

U.S. PATENT DOCUMENTS 8,809,823 B1    8/2014  Senekerimyan et al.
2010/0025223 A1*  2/2010  Yanagida .............. H05G 2/003
                                                        204/157.15
(Continued)

FOREIGN PATENT DOCUMENTS

JP    2010-003548 A    1/2010
JP    2012-169241 A    9/2012
(Continued)

OTHER PUBLICATIONS

International Preliminary Report on Patentability and Written Opinion issued in PCT/JP2018/012731; dated Sep. 29, 2020.
(Continued)

*Primary Examiner* — Peter B Kim
(74) *Attorney, Agent, or Firm* — Studebaker & Brackett PC

(57) ABSTRACT

An extreme ultraviolet light generating system includes a chamber; a target supply unit configured to successively output, toward a predetermined region in the chamber, a plurality of droplets including a first droplet and a second droplet of a target substance; a trajectory correcting laser apparatus configured to apply a trajectory correcting laser beam to each of the droplets moving from the target supply unit toward the predetermined region; a drive laser apparatus configured to apply a drive laser beam to each droplet having reached the predetermined region to generate plasma; and a control unit configured to control the trajectory correcting laser apparatus such that intensity of the trajectory correcting laser beam applied to the first droplet is different from intensity of the trajectory correcting laser beam applied to the second droplet.

19 Claims, 15 Drawing Sheets

(51) Int. Cl.
G21K 5/02 (2006.01)
H05G 2/00 (2006.01)

(56) References Cited

U.S. PATENT DOCUMENTS

| | | |
|---|---|---|
| 2012/0248344 A1 | 10/2012 | Wakabayashi et al. |
| 2014/0091239 A1 | 4/2014 | van der Burgt et al. |
| 2014/0203195 A1 | 7/2014 | Fleurov et al. |
| 2016/0255707 A1 | 9/2016 | Ueda et al. |
| 2017/0311429 A1 | 10/2017 | Rafac et al. |

FOREIGN PATENT DOCUMENTS

| | | |
|---|---|---|
| JP | 2015-520513 A | 7/2015 |
| JP | 2016-509343 A | 3/2016 |
| JP | 2016-538703 A | 12/2016 |
| WO | 2005/089130 A2 | 9/2005 |
| WO | 2013/174620 A1 | 11/2013 |

OTHER PUBLICATIONS

International Search Report issued in PCT/JP2018/012731; dated Jun. 19, 2018.

* cited by examiner

Fig. 13

| PATTERN No. | | | TARGET VALUE OF EUV LIGHT ENERGY | REPETITION FREQUENCY IN BURST PERIOD | DURATION OF INTERMISSION PERIOD | NUMBER OF BURSTS |
|---|---|---|---|---|---|---|
| 1 | 1 | 1 | E1 | 100 kHz | T1 | N1 |
|   |   | 2 | E1 | 100 kHz | T2 | N1 |
|   |   | ... | ... | ... | ... | ... |
|   | 2 | 1 | E1 | 75 kHz | T1 | N1 |
|   |   | 2 | E1 | 75 kHz | T2 | N1 |
|   |   | ... | ... | ... | ... | ... |
|   | ... | ... | ... | ... | ... | ... |
| 2 | 1 | 1 | E2 | 100 kHz | T1 | N1 |
|   |   | 2 | E2 | 100 kHz | T2 | N1 |
|   |   | ... | ... | ... | ... | ... |
|   | 2 | 1 | E2 | 75 kHz | T1 | N1 |
|   |   | 2 | E2 | 75 kHz | T2 | N1 |
|   |   | ... | ... | ... | ... | ... |
|   | ... | ... | ... | ... | ... | ... |
| ... | ... | ... | ... | ... | ... | ... |
| N | 1 | 1 | EN | 100 kHz | T1 | N1 |
|   |   | 2 | EN | 100 kHz | T2 | N1 |
|   |   | ... | ... | ... | ... | ... |
|   | 2 | 1 | EN | 75 kHz | T1 | N1 |
|   |   | 2 | EN | 75 kHz | T2 | N1 |
|   |   | ... | ... | ... | ... | ... |
|   | ... | ... | ... | ... | ... | ... |
| 1 | 1 | 1 | E1 | 100 kHz | T1 | N2 |
|   |   | 2 | E1 | 100 kHz | T2 | N2 |
|   |   | ... | ... | ... | ... | ... |
|   | 2 | 1 | E1 | 75 kHz | T1 | N2 |
|   |   | 2 | E1 | 75 kHz | T2 | N2 |
|   |   | ... | ... | ... | ... | ... |
|   | ... | ... | ... | ... | ... | ... |
| 2 | 1 | 1 | E2 | 100 kHz | T1 | N2 |
|   |   | 2 | E2 | 100 kHz | T2 | N2 |
|   |   | ... | ... | ... | ... | ... |
|   | 2 | 1 | E2 | 75 kHz | T1 | N2 |
|   |   | 2 | E2 | 75 kHz | T2 | N2 |
|   |   | ... | ... | ... | ... | ... |
|   | ... | ... | ... | ... | ... | ... |
| ... | ... | ... | ... | ... | ... | ... |
| N | 1 | 1 | EN | 100 kHz | T1 | N2 |
|   |   | 2 | EN | 100 kHz | T2 | N2 |
|   |   | ... | ... | ... | ... | ... |
|   | 2 | 1 | EN | 75 kHz | T1 | N2 |
|   |   | 2 | EN | 75 kHz | T2 | N2 |
|   |   | ... | ... | ... | ... | ... |
|   | ... | ... | ... | ... | ... | ... |

EXTREME ULTRAVIOLET LIGHT GENERATING SYSTEM AND ELECTRONIC DEVICE MANUFACTURING METHOD

CROSS-REFERENCE TO RELATED APPLICATIONS

The present application is a continuation application of International Application No. PCT/JP2018/012731 filed on Mar. 28, 2018, the entire contents of which are hereby incorporated by reference.

BACKGROUND

1. Technical Field

The present disclosure relates to an extreme ultraviolet light generating system and an electronic device manufacturing method.

2. Related Art

Recently, miniaturization of semiconductor processes has involved rapidly increasing miniaturization of transfer patterns for use in photolithography of the semiconductor processes. In the next generation, microfabrication at 70 nm to 45 nm and further microfabrication at 32 nm or less will be required. Thus, to satisfy the requirement for the microfabrication at 32 nm or less, development of an exposure apparatus is expected including a combination of an extreme ultraviolet light generating apparatus configured to generate extreme ultraviolet (EUV) light having a wavelength of about 13 nm and reduced projection reflection optics.

Three types of EUV light generating apparatuses have been proposed: a laser produced plasma (LPP) apparatus using plasma generated by irradiating a target substance with a laser beam, a discharge produced plasma (DPP) apparatus using plasma generated by electric discharge, and a synchrotron radiation (SR) apparatus using synchrotron radiation light.

LIST OF DOCUMENTS

Patent Documents

Patent Document 1: Japanese Unexamined Patent Application Publication No. 2010-003548
Patent Document 2: US Published Patent Application No. 2016/0255707
Patent Document 3: International Publication No. 2005/089130
Patent Document 4: US Published Patent Application No. 2014/0091239

SUMMARY

An extreme ultraviolet light generating system according to one aspect of the present disclosure includes a chamber; a target supply unit configured to successively output, toward a predetermined region in the chamber, a plurality of droplets including a first droplet and a second droplet of a target substance; a trajectory correcting laser apparatus configured to apply a trajectory correcting laser beam to each of the droplets moving from the target supply unit toward the predetermined region; a drive laser apparatus configured to apply a drive laser beam to each droplet having reached the predetermined region to generate plasma; and a control unit configured to control the trajectory correcting laser apparatus such that intensity of the trajectory correcting laser beam applied to the first droplet is different from intensity of the trajectory correcting laser beam applied to the second droplet.

An electronic device manufacturing method according to one aspect of the present disclosure includes generating extreme ultraviolet light by applying a drive laser beam to a droplet with an extreme ultraviolet light generating system, the extreme ultraviolet light generating system including a chamber, a target supply unit configured to successively output, toward a predetermined region in the chamber, a plurality of droplets including a first droplet and a second droplet of a target substance, a trajectory correcting laser apparatus configured to apply a trajectory correcting laser beam to each of the droplets moving from the target supply unit toward the predetermined region, a drive laser apparatus configured to apply a drive laser beam to each droplet having reached the predetermined region to generate plasma, and a control unit configured to control the trajectory correcting laser apparatus such that intensity of the trajectory correcting laser beam applied to the first droplet is different from intensity of the trajectory correcting laser beam applied to the second droplet; outputting the extreme ultraviolet light to an exposure apparatus; and exposing the extreme ultraviolet light onto a photosensitive substrate within the exposure apparatus to manufacture an electronic device.

BRIEF DESCRIPTION OF THE DRAWINGS

With reference to the accompanying drawings, some embodiments of the present disclosure will be described below merely by way of example.

FIG. 13 shows exemplary output parameters of EUV light.

DESCRIPTION OF EMBODIMENTS

Figure 1:
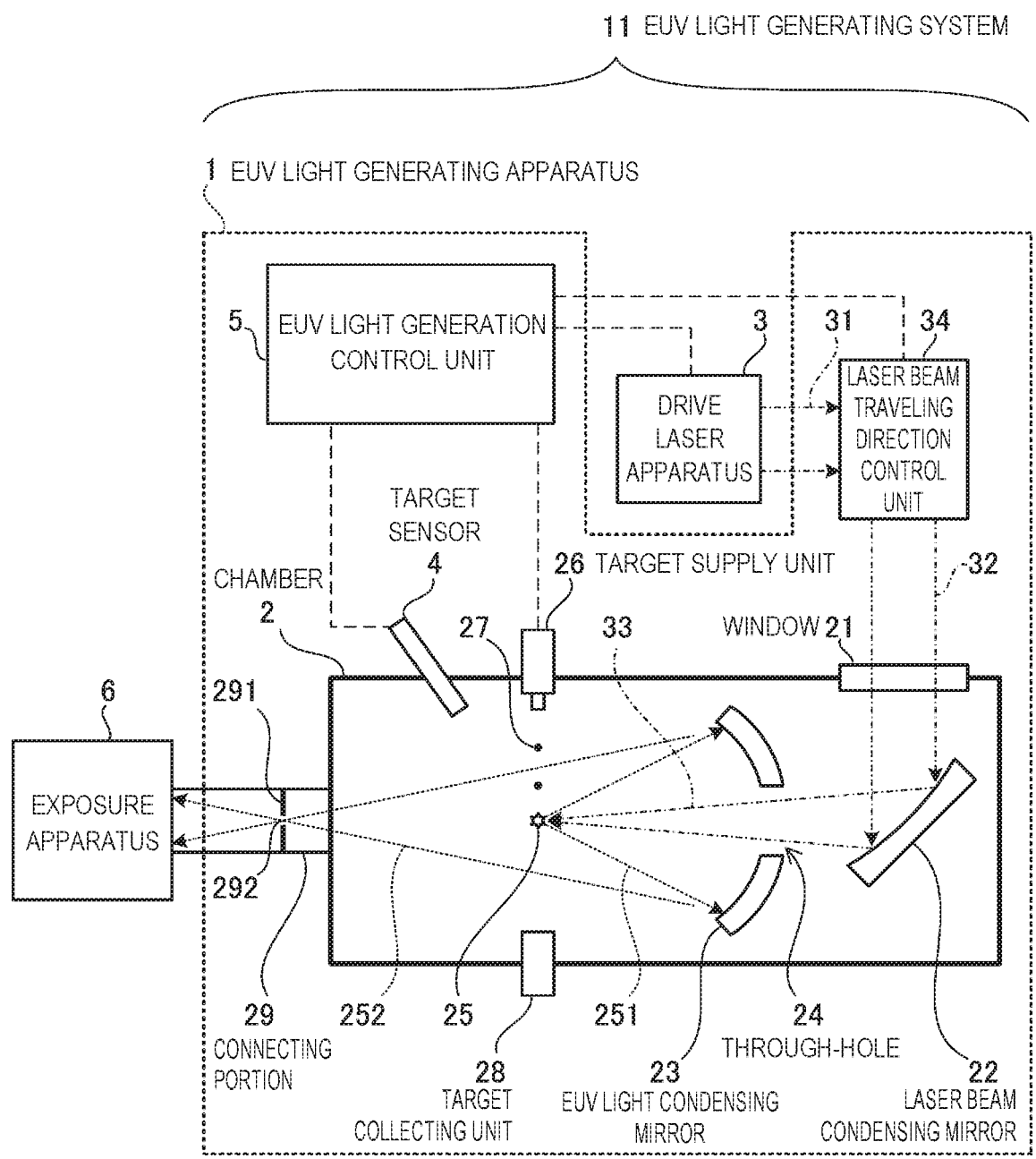
FIG. 1 schematically shows a configuration of an exemplary LPP EUV light generating system.

<Contents>
1. Overall Description of EUV Light Generating System
   1.1 Configuration
   1.2 Operation
2. EUV Light Generating System According to Comparative Example
   2.1 Configuration
   2.2 Operation
   2.3 Problem
3. EUV Light Generating System Including Trajectory Correcting Laser Apparatus
   3.1 Configuration
   3.2 Operation
   3.3 Principle of Trajectory Correction
   3.4 Shape of Trajectory Correcting Laser Beam
   3.5 Optical System Configured to Change Beam Intensity Distribution of Trajectory Correcting Laser Beam
   3.6 Control
   3.7 Effect
4. EUV Light Generating System Including a Plurality of Trajectory Correcting Laser Units
   4.1 Configuration
   4.2 Operation and Effect
5. EUV Light Generating System Configured to Control Output Parameter of Trajectory Correcting Laser Beam Based on Output Parameter of EUV Light
   5.1 Configuration
   5.2 Operation Principle
   5.3 Control
   5.4 Exemplary Output Parameters of EUV Light
   5.5 Effect
   5.6 Variant
6. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Overall Description of EUV Light Generating System
   1.1 Configuration

FIG. 1 schematically shows a configuration of an exemplary LPP EUV light generating system. An EUV light generating apparatus 1 is used together with at least one drive laser apparatus 3. In the present application, a system including the EUV light generating apparatus 1 and the drive laser apparatus 3 is referred to as an EUV light generating system 11. As shown in FIG. 1 and described below in detail, the EUV light generating apparatus 1 includes a chamber 2 and a target supply unit 26. The chamber 2 is configured to be sealable. The target supply unit 26 is, for example, mounted to extend through a wall of the chamber 2. A material of a target substance output from the target supply unit 26 may include tin, terbium, gadolinium, lithium, xenon, or any combinations of two or more thereof, but is not limited thereto.

The wall of the chamber 2 has at least one through-hole. A window 21 is provided in the through-hole. A pulse laser beam 32 output from the drive laser apparatus 3 passes through the window 21. In the chamber 2, an EUV light condensing mirror 23 having, for example, a spheroidal reflective surface is arranged. The EUV light condensing mirror 23 has first and second focal points. On a surface of the EUV light condensing mirror 23, a multilayer reflective film including, for example, alternately stacked molybdenum and silicon is formed. The EUV light condensing mirror 23 is arranged such that, for example, the first focal point is located in a plasma generating region 25 and the second focal point is located at an intermediate focusing (IF) point 292. A through-hole 24 is provided at a center of the EUV light condensing mirror 23, and a pulse laser beam 33 passes through the through-hole 24.

The EUV light generating apparatus 1 includes an EUV light generation control unit 5, a target sensor 4, and the like. The target sensor 4 has an imaging function, and is configured to detect presence, a trajectory, a position, a speed, and the like of a target 27.

The EUV light generating apparatus 1 includes a connecting portion 29 that provides communication between an interior of the chamber 2 and an interior of an exposure apparatus 6. The connecting portion 29 includes therein a wall 291 having an aperture. The wall 291 is arranged such that the aperture is located at the second focal point of the EUV light condensing mirror 23.

The EUV light generating apparatus 1 further includes a laser beam traveling direction control unit 34, a laser beam condensing mirror 22, a target collecting unit 28 for collecting the target 27, and the like. The laser beam traveling direction control unit 34 includes an optical element for defining a traveling direction of a laser beam, and an actuator for adjusting a position, an orientation, and the like of the optical element.

1.2 Operation

With reference to FIG. 1, a pulse laser beam 31 output from the drive laser apparatus 3 passes through the laser beam traveling direction control unit 34, and enters, as the pulse laser beam 32, the chamber 2 through the window 21. The pulse laser beam 32 travels along at least one laser beam path in the chamber 2, and is reflected by the laser beam condensing mirror 22 and applied as the pulse laser beam 33 to at least one target 27.

The target supply unit 26 outputs the target 27 toward the plasma generating region 25 in the chamber 2. The target 27 is irradiated with at least one pulse included in the pulse laser beam 33. Plasma is generated from the target 27 irradiated with the pulse laser beam, and radiates radiation light 251. The EUV light condensing mirror 23 reflects EUV light included in the radiation light 251 with higher reflectance than light in a different wavelength range. Reflected light 252 including the EUV light reflected by the EUV light condensing mirror 23 is condensed at the intermediate focusing point 292 and is output to the exposure apparatus 6. One target 27 may be irradiated with a plurality of pulses included in the pulse laser beam 33.

The EUV light generation control unit 5 collectively controls the entire EUV light generating system 11. The EUV light generation control unit 5 processes image data or the like of the target 27 captured by the target sensor 4. The EUV light generation control unit 5 also controls, for example, output timing of the target 27, an output direction of the target 27, and the like. The EUV light generation control unit 5 further controls, for example, oscillation timing of the drive laser apparatus 3, a traveling direction of the pulse laser beam 32, a focusing position of the pulse laser beam 33, and the like. These various types of control are merely exemplary, and different types of control may be added as required.

Figure 2:
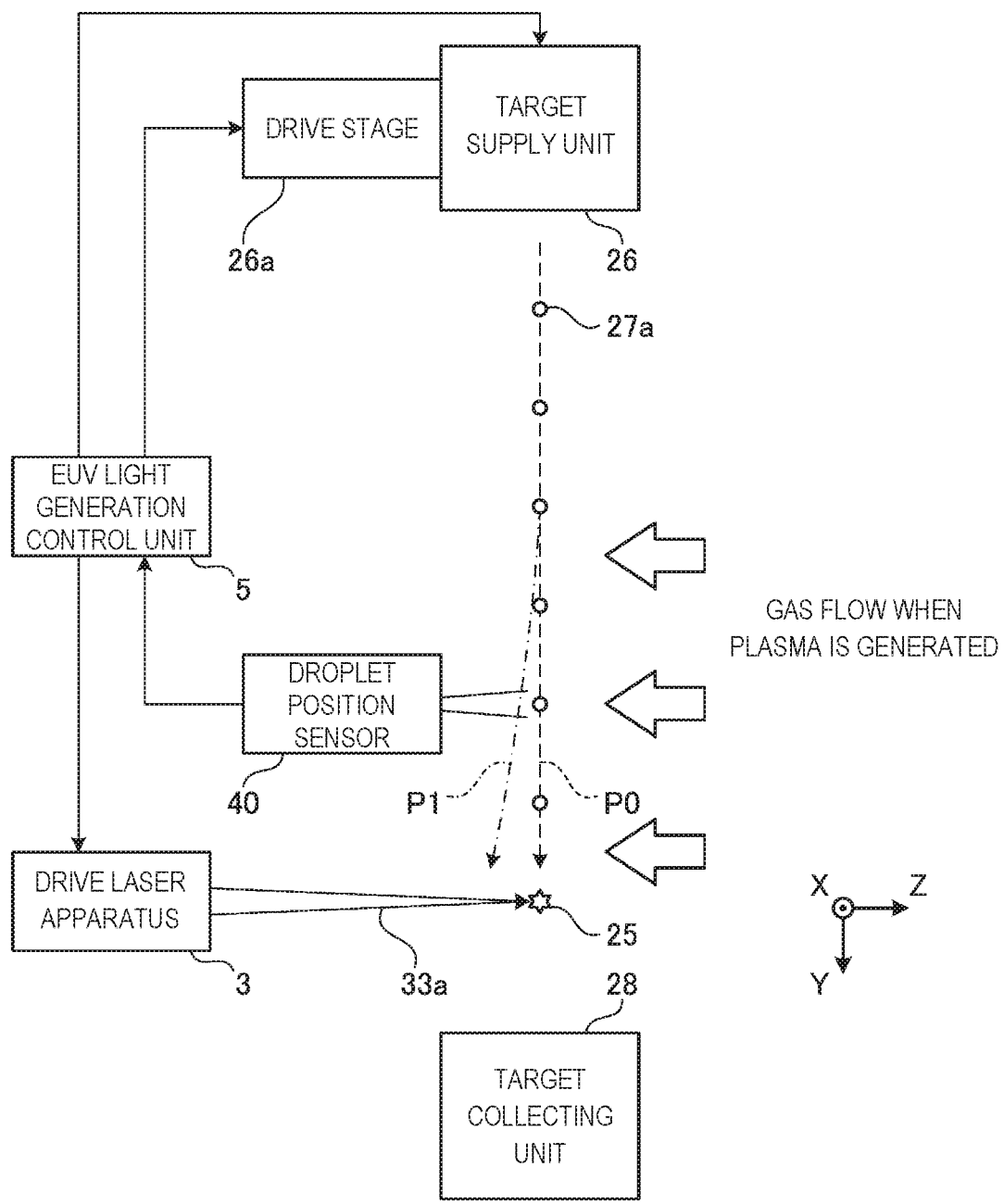
FIG. 2 schematically shows part of an EUV light generating system according to a comparative example.

2. EUV Light Generating System According to Comparative Example 2.1 Configuration FIG. 2 schematically shows part of an EUV light generating system according to a comparative example. In FIG. 2, a chamber 2, a laser beam condensing mirror 22, an EUV light condensing mirror 23, a laser beam traveling direction control unit 34, and the like are not shown. As shown in FIG. 2, the EUV light generating apparatus according to the comparative example includes a droplet position sensor 40 and a drive stage 26a.

A direction of a plurality of droplets 27a output from a target supply unit 26 is a +Y direction. A direction of a drive laser beam 33a applied to the droplets 27a is a +Z direction. Directions perpendicular to both the +Y direction and the +Z direction are a +X direction and a −X direction. The plurality of droplets 27a are droplet-like targets. The drive laser beam 33a is a pulse laser beam output from a drive laser apparatus 3.

The droplet position sensor 40 includes, for example, an imaging device. The droplet position sensor 40 is configured to detect a droplet 27a moving from the target supply unit 26 toward a plasma generating region 25 and to output detected data to an EUV light generation control unit 5. The droplet position sensor 40 is desirably arranged to detect a droplet 27a near the plasma generating region 25, for example, a droplet 27a immediately before reaching the plasma generating region 25.

The drive stage 26a is connected to the target supply unit 26. The drive stage 26a is configured to change a position or an orientation of the target supply unit 26 relative to the plasma generating region 25 in accordance with a control signal output from the EUV light generation control unit 5.

2.2 Operation

The EUV light generation control unit 5 receives detected data from the droplet position sensor 40, and calculates a position of a droplet 27a in an X direction and a Z direction. The EUV light generation control unit 5 transmits a control signal to the drive stage 26a based on the position of the droplet 27a in the X direction and the Z direction. The drive stage 26a changes the position or the orientation of the target supply unit 26 to change a trajectory of a droplet 27a output thereafter.

The drive laser apparatus 3 may include a pre-pulse laser apparatus and a main pulse laser apparatus (not shown). A droplet 27a is irradiated with a pre-pulse laser beam as a drive laser beam output from the pre-pulse laser apparatus and diffused to form a diffused target. The diffused target is irradiated with a main pulse laser beam as a drive laser beam output from the main pulse laser apparatus to generate plasma from a target substance. One droplet 27a may be successively irradiated with a plurality of pre-pulse laser beams from a plurality of pre-pulse laser apparatuses (not shown) to form a diffused target.

The EUV light generation control unit 5 may calculate, based on the detected data received from the droplet position sensor 40, a position of the droplet 27a in a Y direction at predetermined timing. The EUV light generation control unit 5 may control, based on the position of the droplet 27a in the X direction, the Y direction, and the Z direction, the drive laser apparatus 3 or an actuator of the laser beam traveling direction control unit 34 to change a focusing position and irradiation timing of the drive laser beam 33a.

2.3 Problem

When plasma is generated from one droplet 27a by the drive laser beam 33a, a particle generated from the plasma may hit a subsequent droplet 27a to change a trajectory of the subsequent droplet 27a. Also, the plasma may heat and expand gas existing near the plasma generating region 25, which changes a flow of the gas to change the trajectory of the subsequent droplet 27a. An ideal trajectory of the droplet 27a is denoted by P0. A trajectory of the droplet 27a changed by an influence of the plasma is denoted by P1. Such a change in trajectory of the droplet 27a may occur at a short time interval of about several tens of microseconds to several milliseconds, and a change amount of the trajectory of the droplet 27a may be several tens of micrometers to several hundreds of micrometers in the plasma generating region 25.

If the trajectory of the droplet 27a changes at such a short time interval, the drive stage 26a sometimes cannot adjust the trajectory of the droplet 27a on time. Also, with a large change amount of the trajectory of the droplet 27a, the droplet 27a may fall outside a range in which the focusing position of the drive laser beam 33a is adjustable, or a plasma generating position may be shifted, which has a negative influence on quality of EUV light.

In embodiments described below, a droplet 27a is irradiated with a trajectory correcting laser beam, and thus a position of the droplet 27a near a plasma generating region 25 can be adjusted to an ideal position.

Figure 3:
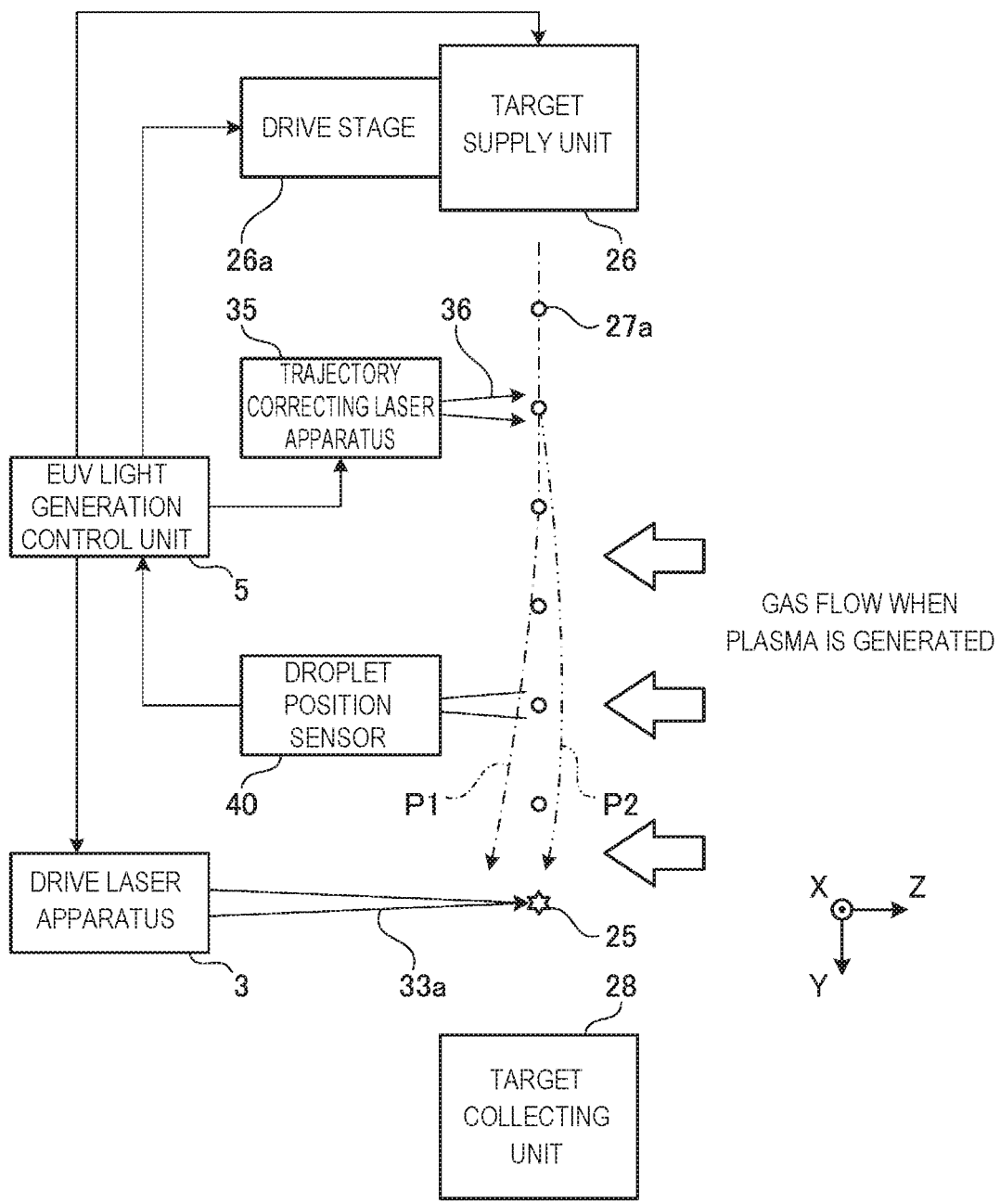
FIG. 3 schematically shows part of an EUV light generating system according to a first embodiment of the present disclosure.

3. EUV Light Generating System Including Trajectory Correcting Laser Apparatus 3.1 Configuration FIG. 3 schematically shows part of an EUV light generating system according to a first embodiment of the present disclosure. In the first embodiment, an EUV light generating apparatus includes a trajectory correcting laser apparatus 35. The trajectory correcting laser apparatus 35 is configured to apply a trajectory correcting laser beam 36 to each of droplets 27a moving from a target supply unit 26 toward a plasma generating region 25.

The trajectory correcting laser apparatus 35 includes, for example, a continuously oscillating laser apparatus. The trajectory correcting laser apparatus 35 includes, for example, a fiber laser apparatus, a semiconductor laser apparatus, or other solid-state laser apparatuses. A wavelength of the trajectory correcting laser beam 36 may be 300 nm to 10 μm.

An EUV light generation control unit 5 is configured to control the trajectory correcting laser apparatus 35 to change an output parameter such as intensity of the trajectory correcting laser beam 36. The output parameter of the trajectory correcting laser beam 36 may include irradiation timing in addition to the beam intensity.

A position of a droplet 27a to be irradiated with the trajectory correcting laser beam 36 is desirably between the target supply unit 26 and a position of a droplet 27a to be detected by a droplet position sensor 40. In this case, the droplet position sensor 40 detects a position of each droplet 27a having been irradiated with the trajectory correcting laser beam 36.

It is desirable that a distance from the target supply unit 26 to the position of the droplet 27a to be irradiated with the trajectory correcting laser beam 36 be 2 mm or longer and be shorter than a distance from the target supply unit 26 to the plasma generating region 25.

3.2 Operation

The EUV light generation control unit 5 receives detected data from the droplet position sensor 40, and calculates a position of the droplet 27a in an X direction and a Z direction. The EUV light generation control unit 5 transmits a control signal to the trajectory correcting laser apparatus 35 in accordance with the position of the droplet 27a in the X direction and the Z direction. The trajectory correcting laser apparatus 35 applies the trajectory correcting laser beam 36 to droplets 27a subsequently passing through an optical path of the trajectory correcting laser beam 36.

With a direction of the trajectory correcting laser beam 36 to be applied to a droplet 27a being a first direction, a trajectory P2 of a droplet 27a having been irradiated with the trajectory correcting laser beam 36 is shifted in the first direction from a trajectory P1 of a droplet 27a having not been irradiated with the trajectory correcting laser beam 36. This allows adjustment of the position of the droplet 27a near the plasma generating region 25. In FIG. 3, the first direction matches a +Z direction, but is not limited to the +Z direction.

3.3 Principle of Trajectory Correction

Figure 4A:
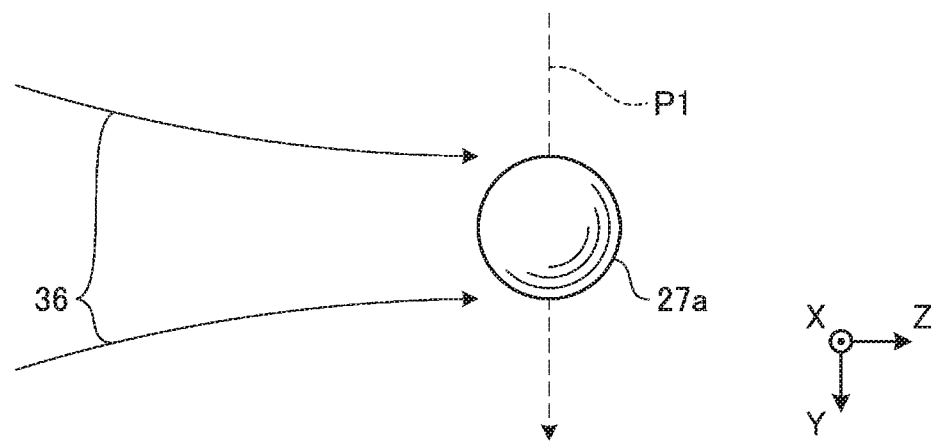
FIG. 4A schematically shows behavior of a droplet irradiated with a trajectory correcting laser beam.
Figure 4B:
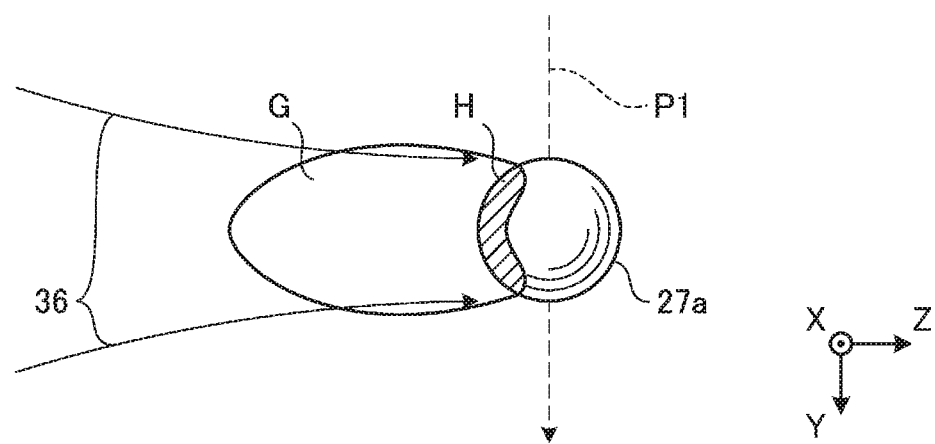
FIG. 4B schematically shows behavior of the droplet irradiated with the trajectory correcting laser beam.
Figure 4C:
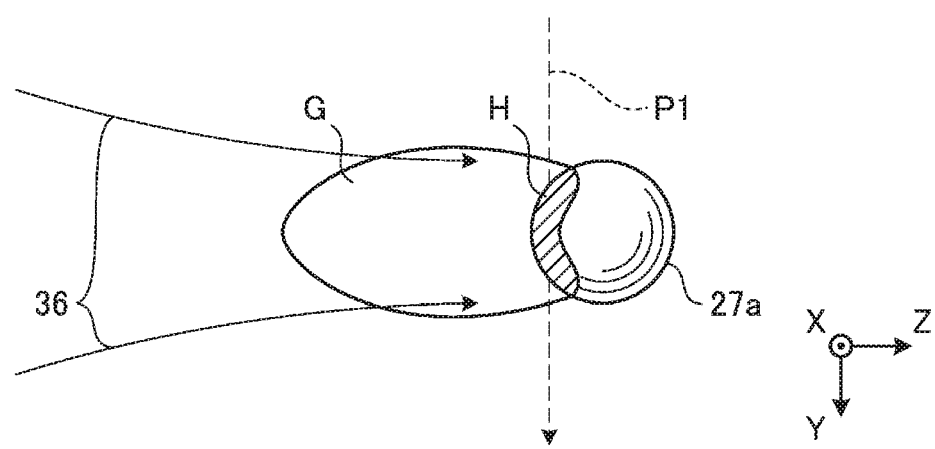
FIG. 4C schematically shows behavior of the droplet irradiated with the trajectory correcting laser beam.

FIGS. 4A to 4C schematically show behavior of a droplet irradiated with a trajectory correcting laser beam. First, as shown in FIG. 4A, the trajectory correcting laser beam 36 is applied to the droplet 27a in the first direction. A side of the droplet 27a opposite to the first direction is irradiated with the trajectory correcting laser beam 36 and is heated.

Then, as shown in FIG. 4B, when part of a surface of the droplet 27a is heated to a boiling point of a target substance, gas G of the target substance is ejected from a heated part H. An ejecting direction of the gas G is, for example, substantially perpendicular to the surface of the heated part H.

Then, as shown in FIG. 4C, due to reaction of the ejected gas G, the droplet 27a receives a force in the first direction. Thus, the trajectory of the droplet 27a having been irradiated with the trajectory correcting laser beam 36 is shifted in the first direction from the trajectory of the droplet 27a having not been irradiated with the trajectory correcting laser beam 36.

The intensity of the trajectory correcting laser beam 36 is desirably such that part of the droplet 27a can be heated to a temperature or higher at which the gas is ejected, for example, $10^5$ W/cm$^2$ or higher. The intensity is desirably such that the droplet 27a is not broken, for example, $10^9$ W/cm$^2$ or lower. Within the range of $10^5$ W/cm$^2$ to $10^9$ W/cm$^2$, higher intensity allows a greater change in trajectory of the droplet 27a, and lower intensity has less influence on the trajectory of the droplet 27a.

Thus, the EUV light generation control unit 5 performs feedback control of the trajectory correcting laser apparatus 35 based on the position of the droplet 27a detected by the droplet position sensor 40. Specifically, the EUV light generation control unit 5 increases the intensity of the trajectory correcting laser beam 36 when the position of the droplet 27a is considerably shifted from a target position. The EUV light generation control unit 5 reduces the intensity of the trajectory correcting laser beam 36 when the position of the droplet 27a is slightly shifted from the target position. When there is no need to change the trajectory of the droplet 27a, the droplet 27a may be irradiated with a trajectory correcting laser beam 36 having intensity lower than $10^5$ W/cm$^2$, or output of the trajectory correcting laser beam 36 may be stopped. As such, the EUV light generation control unit 5 can control the trajectory correcting laser apparatus 35 such that the intensity of the trajectory correcting laser beam 36 applied to one droplet 27a is different from the intensity of the trajectory correcting laser beam 36 applied to another droplet 27a. The EUV light generation control unit 5 corresponds to a control unit in the present disclosure.

3.4 Shape of Trajectory Correcting Laser Beam

Figure 5A:
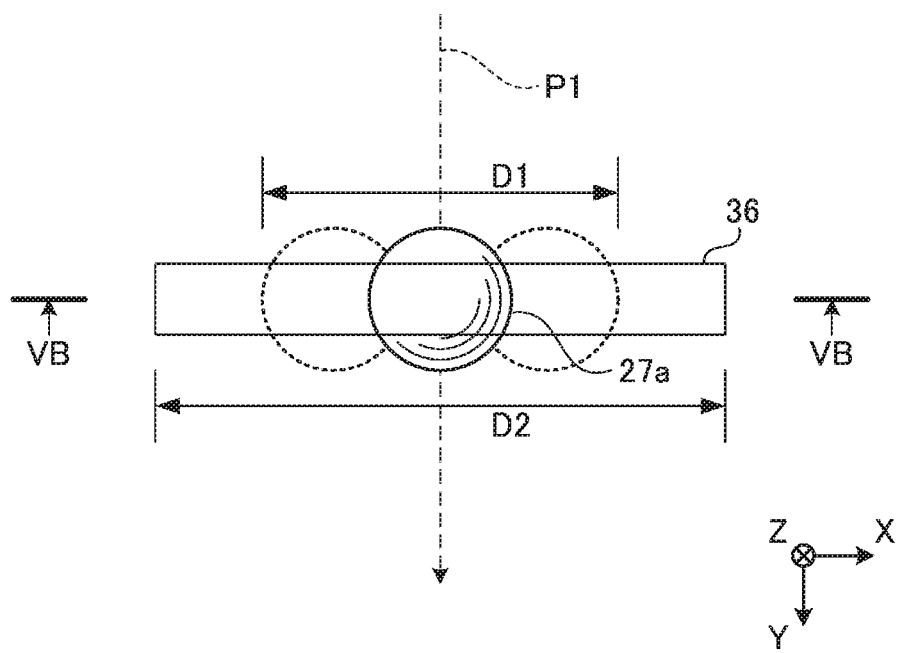
FIG. 5A shows a section perpendicular to a traveling direction of the trajectory correcting laser beam and a droplet passing through an optical path of the trajectory correcting laser beam.

FIG. 5A shows a section perpendicular to a traveling direction of the trajectory correcting laser beam and a droplet passing through an optical path of the trajectory correcting laser beam. The trajectory P1 of the droplet 27a moving in a +Y direction may vary in a +X direction or a −X direction. Thus, the trajectory correcting laser beam 36 desirably has a beam section long in directions perpendicular to both an optical path axis of the trajectory correcting laser beam 36 and a moving direction of the droplet 27a. The directions perpendicular to both the optical path axis of the trajectory correcting laser beam 36 and the moving direction of the droplet 27a are herein ±X directions. A beam width D2 of the trajectory correcting laser beam 36 in the ±X directions is desirably larger than a variation range D1 of the trajectory of the droplet 27a in the ±X directions. Thus, even if the trajectory of the droplet 27a varies in the +X direction or the −X direction, each droplet 27a can be irradiated with the trajectory correcting laser beam 36.

Figure 5B:
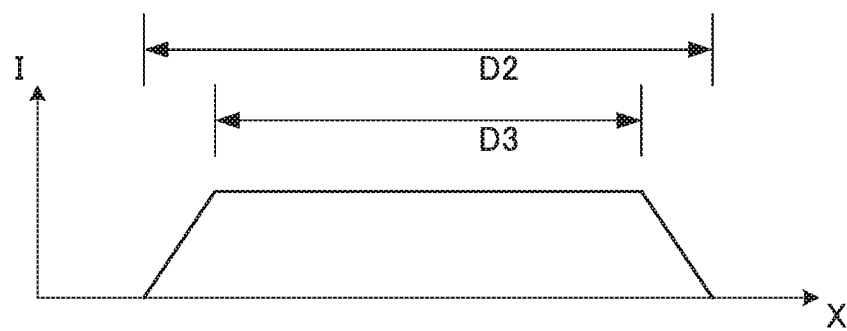
FIG. 5B shows exemplary beam intensity distribution of the trajectory correcting laser beam taken along the line VB-VB in FIG. 5A.

FIG. 5B shows exemplary beam intensity distribution of the trajectory correcting laser beam taken along the line VB-VB in FIG. 5A. As shown in FIG. 5B, beam intensity distribution along the ±X directions desirably has a substantially top-hat shape. Thus, even if the trajectory of the droplet 27a is shifted in the +X direction or the −X direction, variations in the intensity of the trajectory correcting laser beam 36 applied to the droplet 27a can be suppressed. In the beam intensity distribution in FIG. 5B, a width D3 of a region with substantially uniform beam intensity is desirably larger than the variation range D1 of the trajectory of the droplet 27a.

The beam intensity distribution of the trajectory correcting laser beam 36 along the moving direction of the droplet 27a is desirably substantially uniform near the trajectory of the droplet 27a. In this case, when the trajectory correcting laser apparatus 35 includes a continuously oscillating laser, energy absorbed from the trajectory correcting laser beam 36 by the droplet 27a depends on a moving speed of the droplet 27a. Since the moving speed of the droplet 27a is substantially constant, the energy absorbed from the trajectory correcting laser beam 36 by the droplet 27a can be substantially constant.

3.5 Optical System Configured to Change Beam Intensity Distribution of Trajectory Correcting Laser Beam FIGS. 6A, 6B, and 6C to 6E show first, second, and third examples of optical systems for reducing variations in beam intensity distribution of the trajectory correcting laser beam. The optical systems shown in these drawings are arranged on an optical path of the trajectory correcting laser beam 36 between the trajectory correcting laser apparatus 35 and the trajectory of the droplet 27a.

Figure 6A:
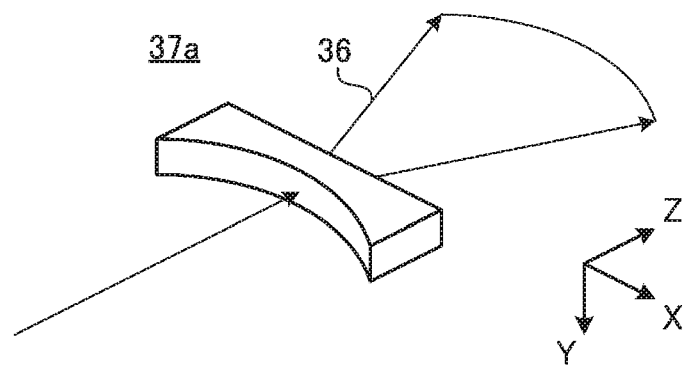
FIG. 6A shows a first example of an optical system for reducing variations in beam intensity distribution of the trajectory correcting laser beam.

FIG. 6A shows a cylindrical concave lens 37a as a first example. The cylindrical concave lens 37a can achieve the beam shape in FIG. 5A by increasing the beam width of the trajectory correcting laser beam 36 in the ±X directions. The cylindrical concave lens 37a can also reduce variations in beam intensity distribution along the ±X directions by increasing the beam width of the trajectory correcting laser beam 36 in the ±X directions.

Figure 6B:
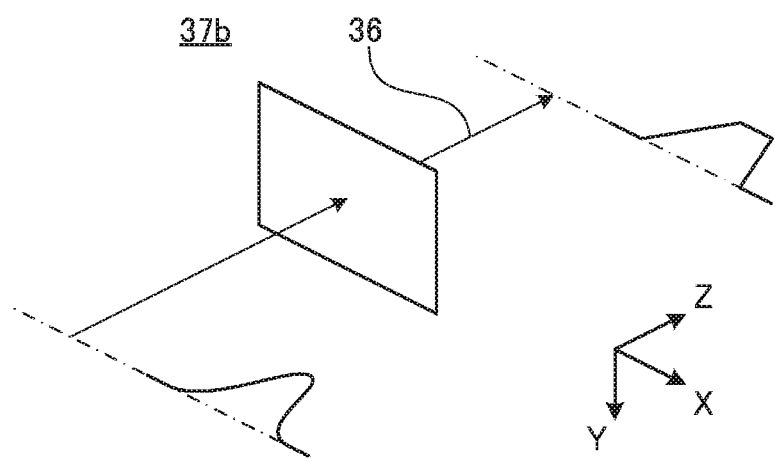
FIG. 6B shows a second example of an optical system for reducing variations in beam intensity distribution of the trajectory correcting laser beam.

FIG. 6B shows a diffraction optical element (DOE) 37b as a second example. The diffraction optical element 37b includes, for example, a transparent plate having minute irregularities for diffracting incident light, and a light condensing optical system (not shown). A pattern of the irregularities of the diffraction optical element 37b is designed so as to provide uniform beam intensity distribution at a focusing point when diffracted light is condensed by the light condensing optical system. FIG. 6B shows beam intensity distribution of the trajectory correcting laser beam 36 before entering the diffraction optical element 37b, and beam intensity distribution of the trajectory correcting laser beam 36 having been emitted from the diffraction optical element 37b and condensed. As such, variations in beam intensity distribution can be reduced as shown in FIG. 5B.

Figure 6C:
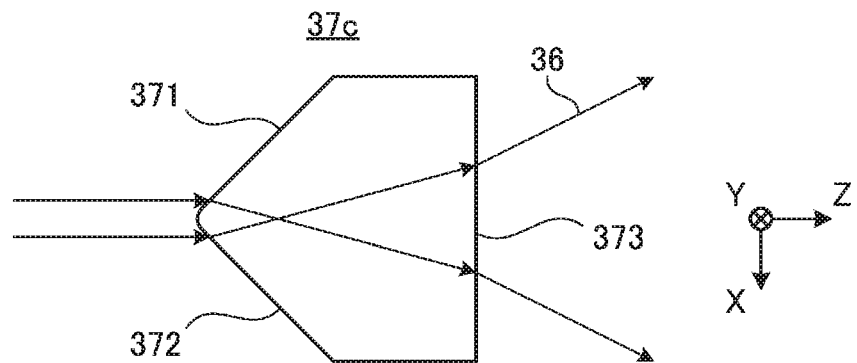
FIG. 6C shows a third example of an optical system for reducing variations in beam intensity distribution of the trajectory correcting laser beam.
Figure 6D:
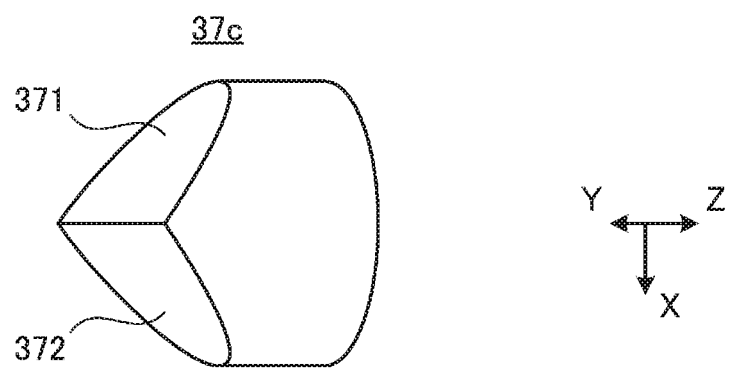
FIG. 6D shows the third example of the optical system for reducing variations in beam intensity distribution of the trajectory correcting laser beam.
Figure 6E:
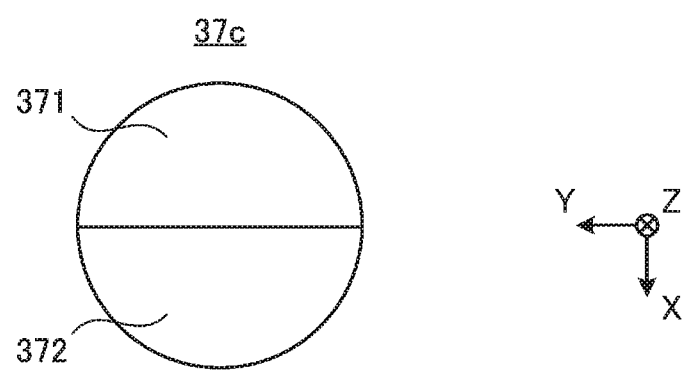
FIG. 6E shows the third example of the optical system for reducing variations in beam intensity distribution of the trajectory correcting laser beam.

FIGS. 6C to 6E show a Powell lens 37c as a third example. The Powell lens 37c is a type of line generator, and is commercially available from, for example, Edmund Optics. When the trajectory correcting laser beam 36 is incident on first and second surfaces 371 and 372 sharing one edge of the Powell lens 37c, beams refracted by the surfaces 371 and 372 are emitted in different directions from a third surface 373. This can increase the beam width of the trajectory correcting laser beam 36 in the ±X directions, thereby achieving the beam shape in FIG. 5A. This can also reduce variations in beam intensity distribution along the ±X directions.

3.6 Control

Figure 7:
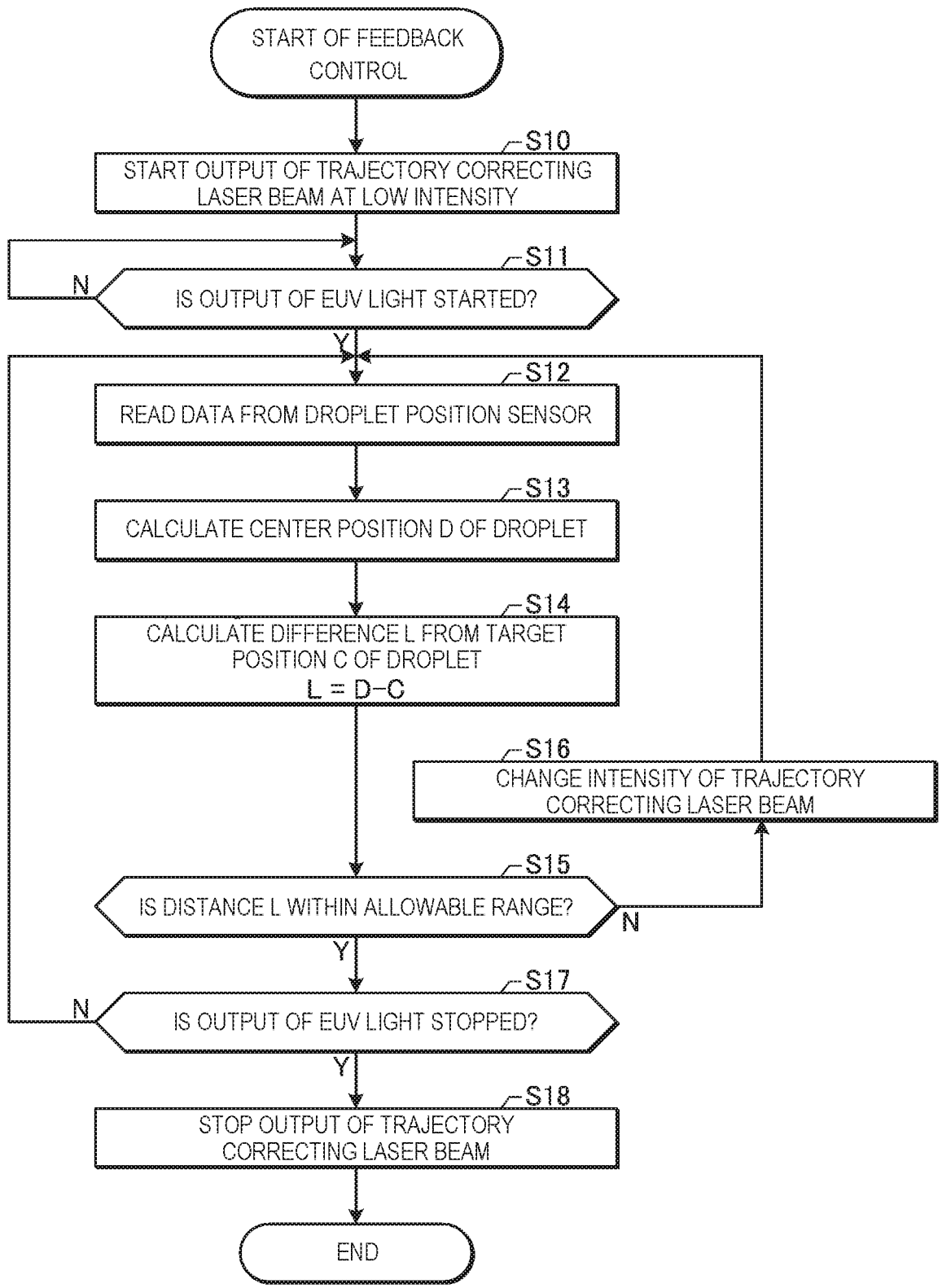
FIG. 7 is a flowchart of processing of an EUV light generation control unit for feedback control of a trajectory correcting laser apparatus in the first embodiment.

FIG. 7 is a flowchart of processing of the EUV light generation control unit for feedback control of the trajectory correcting laser apparatus in the first embodiment. In this flowchart and a flowchart described later, "Y" indicates a branch when it is determined YES, and "N" indicates a branch when it is determined NO.

At S10, the EUV light generation control unit 5 controls the trajectory correcting laser apparatus 35 to start output of a trajectory correcting laser beam 36 at low intensity. The trajectory correcting laser beam 36 at low intensity has intensity having no influence on a trajectory of a droplet 27a.

Then, at S11, the EUV light generation control unit 5 determines whether or not the EUV light generating apparatus 1 starts output of EUV light. For example, the EUV light generation control unit 5 determines whether or not output of a droplet 27a is started by the target supply unit 26, whether or not preparation for generation of the EUV light is finished, and whether or not the EUV light generation control unit 5 has received an EUV light output instruction from an exposure apparatus 6. The preparation for generation of the EUV light may include control of a drive stage 26a and a drive laser apparatus 3 based on detected data from the droplet position sensor 40.

When the output of the EUV light is not started (NO at S11), the EUV light generation control unit 5 waits until determining that the output of the EUV light is started. When the output of the EUV light is started (YES at S11), the EUV light generation control unit 5 proceeds to S12.

At S12, the EUV light generation control unit 5 reads the detected data from the droplet position sensor 40. The detected data from the droplet position sensor 40 contains, for example, an image of a droplet 27a taken by a camera included in the droplet position sensor 40.

Then, at S13, the EUV light generation control unit 5 calculates a center position D of the droplet 27a. For example, the EUV light generation control unit 5 calculates the center position D of the droplet 27a based on the image of the droplet 27a. The center position D of the droplet 27a includes a center position of the droplet 27a in the first direction.

Then, at S14, the EUV light generation control unit 5 calculates a difference L between a target position C of the droplet 27a and the center position D of the droplet 27a by an equation below.

$$L = D - C$$

Then, at S15, the EUV light generation control unit 5 determines whether or not the difference L between the target position C of the droplet 27a and the center position D of the droplet 27a is within an allowable range. The allowable range may be, for example, 10% of a diameter of the droplet 27a. For example, when the diameter of the droplet 27a is 20 μm, the allowable range of the difference L may be −2 μm to 2 μm.

When the difference L is not within the allowable range (NO at S15), the EUV light generation control unit 5 proceeds to S16.

At S16, the EUV light generation control unit 5 controls the trajectory correcting laser apparatus 35 to change the intensity of the trajectory correcting laser beam 36. For example, when the center position D of the droplet 27a is shifted in a direction opposite to the first direction relative to the target position C of the droplet 27a, the EUV light generation control unit 5 controls the trajectory correcting laser apparatus 35 to increase the intensity of the trajectory correcting laser beam 36. On the other hand, when the center position D of the droplet 27a is shifted in the first direction relative to the target position C of the droplet 27a, the EUV light generation control unit 5 controls the trajectory correcting laser apparatus 35 to reduce the intensity of the trajectory correcting laser beam 36.

After S16, the EUV light generation control unit 5 returns to S12.

When the difference L is within the allowable range (YES at S15), the EUV light generation control unit 5 proceeds to S17 without changing the intensity of the trajectory correcting laser beam 36.

At S17, the EUV light generation control unit 5 determines whether or not the EUV light generating apparatus 1 stops the output of the EUV light. For example, the EUV light generation control unit 5 determines whether or not it has received an EUV light stop instruction from the exposure apparatus 6.

When the output of the EUV light is not stopped (NO at S17), the EUV light generation control unit 5 returns to S12.

When the output of the EUV light is stopped (YES at S17), the EUV light generation control unit 5 proceeds to S18.

At S18, the EUV light generation control unit 5 controls the trajectory correcting laser apparatus 35 to stop the output of the trajectory correcting laser beam 36. After S18, the EUV light generation control unit 5 finishes the processing in this flowchart.

3.7 Effect

According to the first embodiment, the trajectory of the droplet 27a can be adjusted by adjusting the intensity of the trajectory correcting laser beam 36. This allows the trajectory of the droplet 27a to be adjusted at a higher response speed than the drive stage 26a. Adjusting the trajectory of the droplet 27a allows adjustment of the position of the droplet 27a near the plasma generating region 25.

4. EUV Light Generating System Including a Plurality of Trajectory Correcting Laser Units

4.1 Configuration

Figure 8:
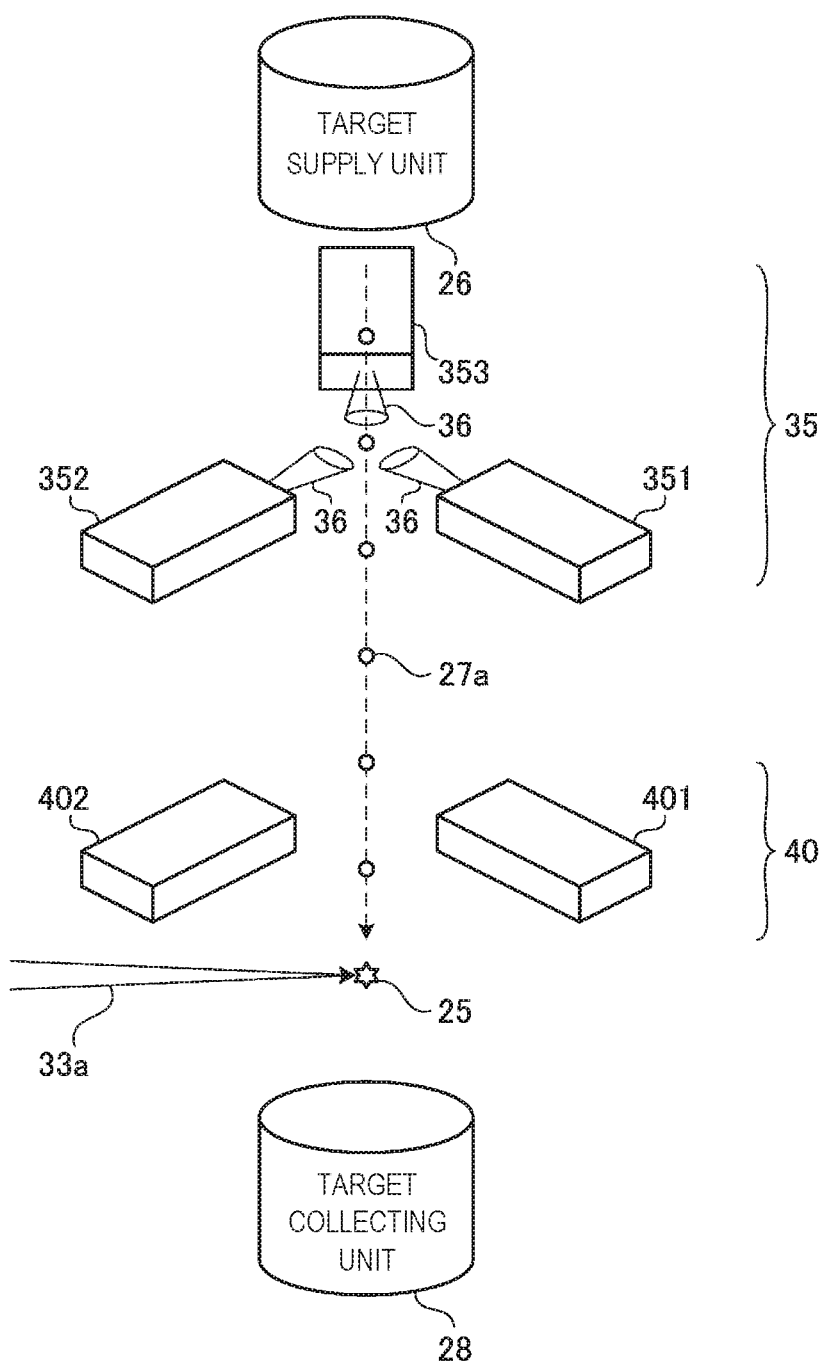
FIG. 8 schematically shows part of an EUV light generating system according to a second embodiment of the present disclosure.

FIG. 8 schematically shows part of an EUV light generating system according to a second embodiment of the present disclosure. In the second embodiment, a trajectory correcting laser apparatus 35 includes a plurality of trajectory correcting laser units. The trajectory correcting laser units include first, second, and third trajectory correcting laser units 351, 352, 353. The first, second, and third trajectory correcting laser units 351, 352, 353 are configured to apply, to a droplet 27a, trajectory correcting laser beams 36 traveling in a first direction, a second direction, and a third direction, respectively. The first direction, the second direction, and the third direction cross a trajectory of the droplet 27a. The first direction, the second direction, and the third direction may be perpendicular to the trajectory of the droplet 27a, and the first direction, the second direction, and the third direction may be separated from each other by 120 degrees.

In the second embodiment, a droplet position sensor 40 includes a plurality of sensor units 401 and 402. The sensor units 401 and 402 detect a position of the droplet 27a from a fourth direction and a fifth direction crossing the trajectory of the droplet 27a. The fourth direction and the fifth direction may be perpendicular to the trajectory of the droplet 27a, and the fourth direction and the fifth direction may be separated from each other by 90 degrees.

4.2 Operation and Effect

The droplet position sensor 40 can use the sensor units 401 and 402 to detect a shift of the droplet 27a in the fourth direction and a shift of the droplet 27a in the fifth direction with high accuracy.

The first trajectory correcting laser unit 351 applies the trajectory correcting laser beam 36 to the droplet 27a in the first direction to change the trajectory of the droplet 27a in the first direction.

The second trajectory correcting laser unit 352 applies the trajectory correcting laser beam 36 to the droplet 27a in the second direction to change the trajectory of the droplet 27a in the second direction.

The third trajectory correcting laser unit 353 applies the trajectory correcting laser beam 36 to the droplet 27a in the third direction to change the trajectory of the droplet 27a in the third direction.

For changing the trajectory of the droplet 27a in a direction between the first direction and the second direction, one droplet 27a may be simultaneously irradiated with the trajectory correcting laser beams 36 from the first and second trajectory correcting laser units 351, 352.

The trajectory of the droplet 27a can be changed in any direction between the first direction and the second direction by changing a ratio between intensity of the trajectory correcting laser beam 36 from the first trajectory correcting laser unit 351 and intensity of the trajectory correcting laser beam 36 from the second trajectory correcting laser unit 352. For example, when the trajectory of the droplet 27a needs to be more greatly changed in the second direction than in the first direction, the intensity of the trajectory correcting laser beam 36 from the second trajectory correcting laser unit 352 is set to be higher than the intensity of the trajectory correcting laser beam 36 from the first trajectory correcting laser unit 351.

Similarly, when the trajectory of the droplet 27a is changed in a direction between the second direction and the third direction, the second and third trajectory correcting laser units 352, 353 may be used.

Similarly, when the trajectory of the droplet 27a is changed in a direction between the third direction and the first direction, the third and first trajectory correcting laser units 353, 351 may be used.

A flowchart in the second embodiment is the same as in FIG. 7, but for example, at S16, the intensity may be set for the trajectory correcting laser beam 36 output from each of the first, second, and third trajectory correcting laser units 351, 352, 353.

Other points are the same as in the first embodiment.

The trajectory correcting laser apparatus 35 may include, not limited to three, two or four or more trajectory correcting laser units. The droplet position sensor 40 may include three or more sensor units.

5. EUV Light Generating System Configured to Control Output Parameter of Trajectory Correcting Laser Beam Based on Output Parameter of EUV Light

5.1 Configuration

Figure 9:
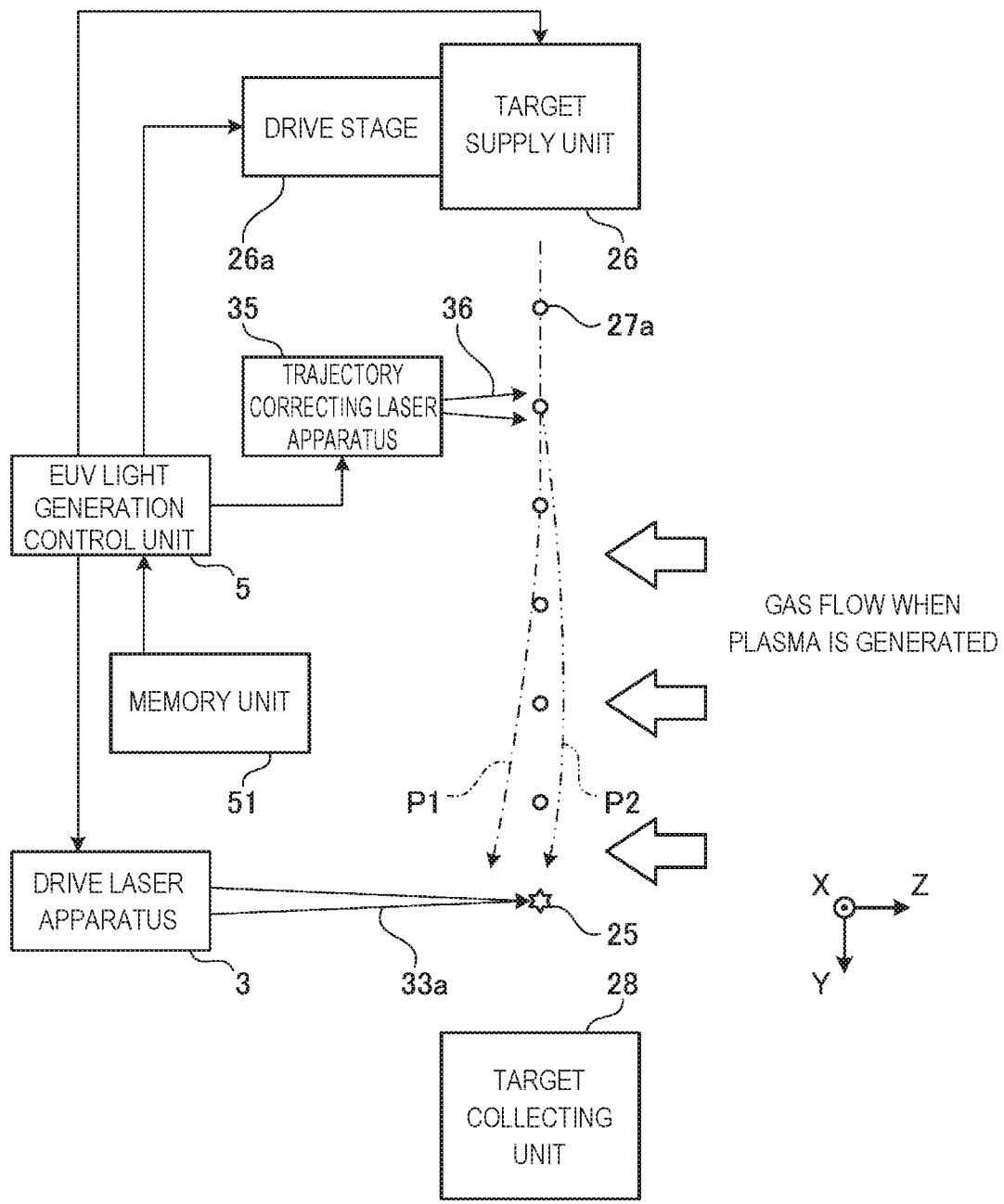
FIG. 9 schematically shows part of an EUV light generating system according to a third embodiment of the present disclosure.

FIG. 9 schematically shows part of an EUV light generating system according to a third embodiment of the present disclosure. In the third embodiment, the EUV light generating apparatus includes a memory unit 51. The memory unit 51 stores an output parameter of EUV light and an output parameter of a trajectory correcting laser beam in association with each other. The memory unit 51 is configured to be readable by an EUV light generation control unit 5.

In the third embodiment, the EUV light generating apparatus does not need to include a droplet position sensor 40.

5.2 Operation Principle

Figure 10:
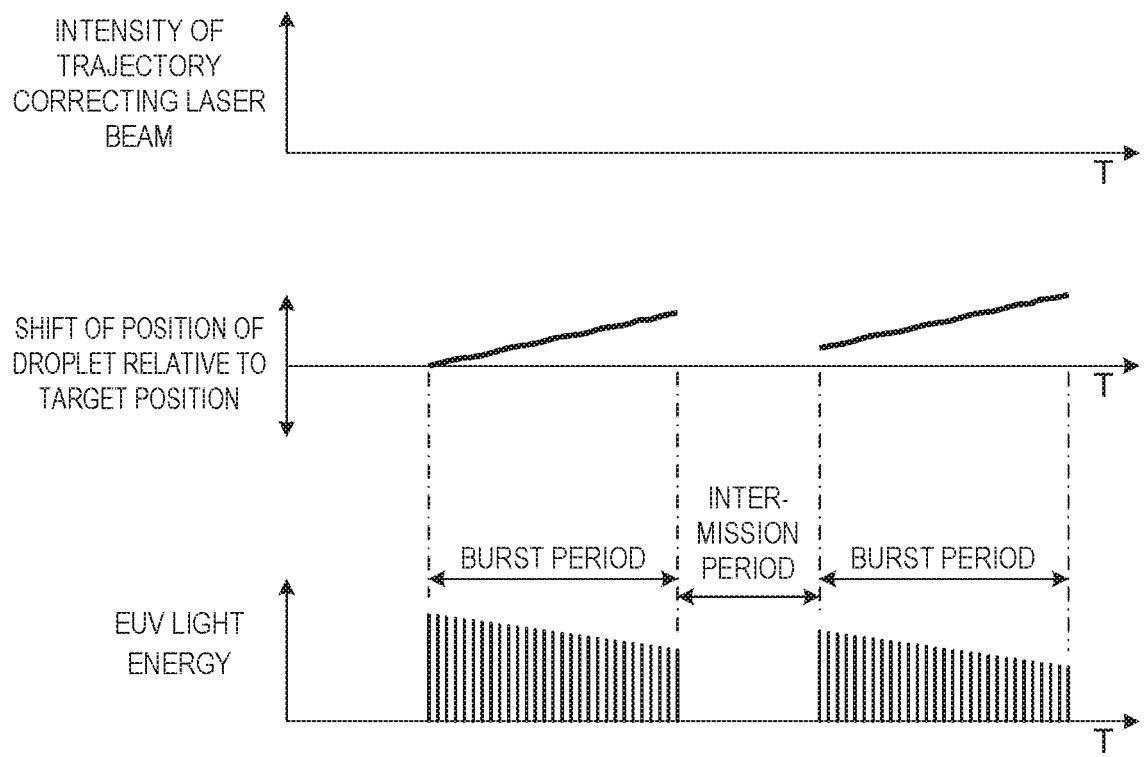
FIG. 10 shows behavior of an EUV light generating apparatus when a trajectory correcting laser apparatus is not operated in the third embodiment.

FIG. 10 shows behavior of the EUV light generating apparatus when a trajectory correcting laser apparatus is not operated in the third embodiment.

In the EUV light generating apparatus, a burst period in which EUV light is output at a predetermined repetition frequency and an intermission period in which the output of the EUV light at the predetermined repetition frequency is stopped are repeated in some cases. Such an operation of repeating the burst period and the intermission period is referred to as a burst operation. In the burst period, for example, light is exposed onto individual chip regions of a semiconductor wafer. The intermission period is, for example, a period in which a wafer stage (not shown) is moved after exposure of a first chip region and before a start of exposure of a second chip region or a period in which a semiconductor wafer placed on the wafer stage is exchanged.

At a start of the burst period, a shift of a position of a droplet 27a relative to a target position may be small. However, after the start of the burst period, generated plasma increases the shift of the position of the droplet 27a relative to the target position. The increase in the shift of the position of the droplet 27a relative to the target position reduces position accuracy of a drive laser beam or causes a shift of a plasma generating position, which reduces EUV light energy. The influence of the plasma differs depending on the EUV light energy or the repetition frequency of the EUV light in the burst period.

When a next burst period is started after an intermission period, the shift of the position of the droplet 27a relative to the target position may be reduced. However, at the start of the next burst period, the shift of the position of the droplet 27a relative to the target position may differ depending on, for example, a duration of the intermission period.

Thus, in the third embodiment, an output parameter of EUV light is previously associated with an output parameter of a trajectory correcting laser beam 36, and the output parameter of the trajectory correcting laser beam 36 is read based on the output parameter of the EUV light to control a trajectory correcting laser apparatus 35.

Figure 11:
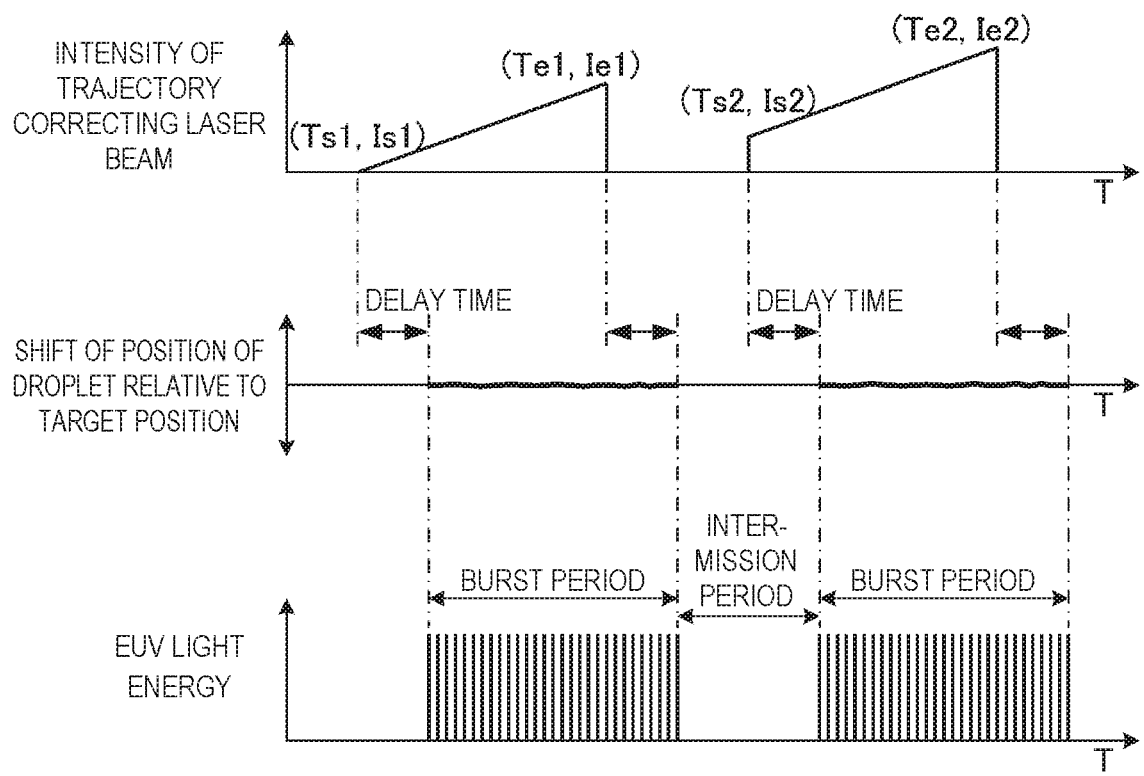
FIG. 11 shows behavior of the EUV light generating apparatus when the trajectory correcting laser apparatus is operated based on an output parameter of EUV light in the third embodiment.

FIG. 11 shows behavior of the EUV light generating apparatus when the trajectory correcting laser apparatus 35 is operated based on the output parameter of the EUV light in the third embodiment.

As shown in FIG. 11, the EUV light generation control unit 5 starts output of the trajectory correcting laser beam 36, for example, at first timing Ts1, Ts2 earlier by a predetermined time than a start of each burst period. The output of the trajectory correcting laser beam 36 is started earlier than the start of the burst period because of a predetermined delay time before a droplet 27a irradiated with the trajectory correcting laser beam 36 reaches a plasma generating region 25. The delay time is calculated by dividing, by a speed V of the droplet 27a, a distance L from a position of the droplet 27a irradiated with the trajectory correcting laser beam 36 to the plasma generating region 25.

The EUV light generation control unit 5 finishes the output of the trajectory correcting laser beam 36, for example, at second timing Te1, Te2 earlier by a predetermined time than a finish of each burst period. The output of the trajectory correcting laser beam 36 is finished earlier than the finish of the burst period for the same reason as described for the start of the burst period.

The EUV light generation control unit 5 controls the trajectory correcting laser apparatus 35, for example, such that intensity of the trajectory correcting laser beam 36 is gradually increased from intensity Is1 at the first timing Ts1 to intensity Ie1 at the second timing Te1. For example, when intensity at third timing between the first timing Ts1 and the second timing Te1 is Im1, Is1 is lower than Im1, and Im1 is lower than Te1. The intensity of the trajectory correcting laser beam 36 is gradually increased because the influence of plasma gradually increases after the start of the burst period. The specific intensity is previously set in accordance with the output parameter of the EUV light to reduce the shift of the position of the droplet 27a relative to the target position.

The output parameter of the trajectory correcting laser beam 36 can be appropriately set to reduce the shift of the position of the droplet 27a relative to the target position, thereby stabilizing EUV light energy. Predicting changes to be controlled and performing control to previously eliminate such changes in this manner is referred to as feedforward control in the present disclosure. The output parameters of the trajectory correcting laser beam 36 include, for example, combinations of indexes described below.
(1) Output start timing Tsn for n-th burst period
(2) Output finish timing Ten for n-th burst period
(3) Beam intensity Isn at start of output for n-th burst period
(4) Beam intensity Ien at finish of output for n-th burst period FIG. 11 shows output parameters Ts1, Te1, Is1, Ie1 of the trajectory correcting laser beam 36 for the first burst period, and output parameters Ts2, Te2, Is2, Ie2 of the trajectory correcting laser beam 36 for the second burst period.

5.3 Control

Figure 12:
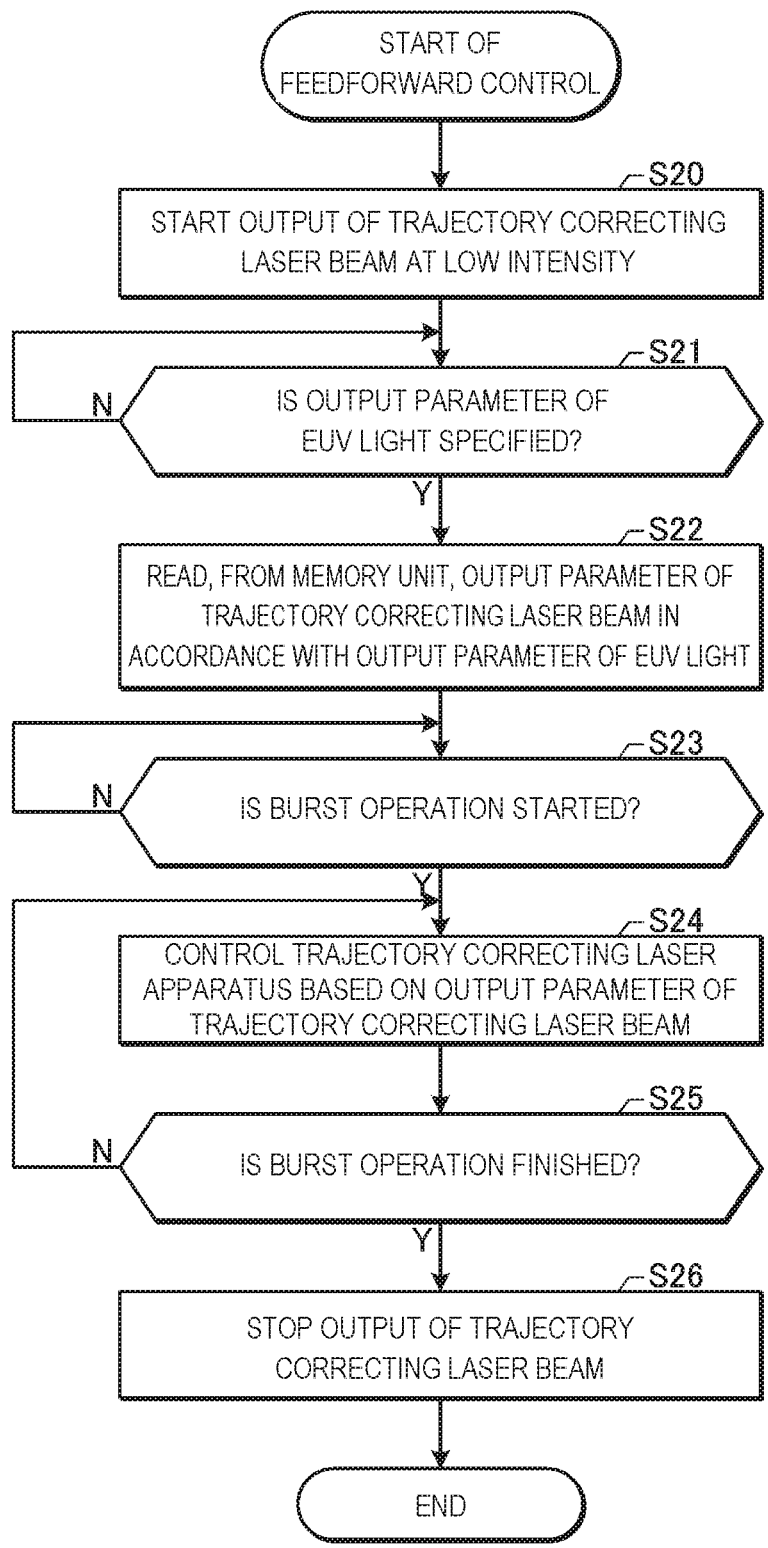
FIG. 12 is a flowchart of processing of an EUV light generation control unit for feedforward control of the trajectory correcting laser apparatus in the third embodiment.

FIG. 12 is a flowchart of processing of the EUV light generation control unit for feedforward control of the trajectory correcting laser apparatus in the third embodiment.

At S20, the EUV light generation control unit 5 controls the trajectory correcting laser apparatus 35 to start output of a trajectory correcting laser beam 36 at low intensity. The trajectory correcting laser beam 36 at low intensity has intensity having no influence on a trajectory of a droplet 27a.

Then, at S21, the EUV light generation control unit 5 determines whether or not an output parameter of EUV light is specified by the exposure apparatus 6.

When the output parameter of the EUV light is not specified (NO at S21), the EUV light generation control unit 5 waits until the output parameter of the EUV light is specified. When the output parameter of the EUV light is specified (YES at S21), the EUV light generation control unit 5 proceeds to S22.

At S22, the EUV light generation control unit 5 reads an output parameter of the trajectory correcting laser beam 36 from the memory unit 51 in accordance with the output parameter of the EUV light.

Then, at S23, the EUV light generation control unit 5 determines whether or not a burst operation is started.

When the burst operation is not started (NO at S23), the EUV light generation control unit 5 waits until the burst operation is started. When the burst operation is started (YES at S23), the EUV light generation control unit 5 proceeds to S24.

At S24, the EUV light generation control unit 5 controls the trajectory correcting laser apparatus 35 in accordance with the output parameter of the trajectory correcting laser beam 36.

Then, at S25, the EUV light generation control unit 5 determines whether or not the burst operation is finished.

When the burst operation is not finished (NO at S25), the EUV light generation control unit 5 returns to S24, and repeats the control of the trajectory correcting laser apparatus 35. When the burst operation is finished (YES at S25), the EUV light generation control unit 5 proceeds to S26.

At S26, the EUV light generation control unit 5 controls the trajectory correcting laser apparatus 35 to stop the output of the trajectory correcting laser beam 36. After S26, the EUV light generation control unit 5 finishes the processing in this flowchart.

5.4 Exemplary Output Parameters of EUV Light

FIG. 13 shows exemplary output parameters of the EUV light. The output parameters of the EUV light include, for example, combinations of indexes described below.
(1) Target value of EUV light energy
(2) Repetition frequency of EUV light in burst period
(3) Duration of intermission period The output parameters of the EUV light are specified by, for example, pattern numbers of three digits. The indexes (1) to (3) correspond to the digits of the pattern numbers.

The first digit of each pattern number specifies a target value of EUV light energy.

The second digit of each pattern number specifies a repetition frequency of the EUV light in the burst period.

The third digit of each pattern number specifies a duration of the intermission period.

For example, when the pattern number of three digits is "112", as shown in FIG. 12, the indexes are specified as described below.
(1) The target value of the EUV light energy is E1.
(2) The repetition frequency of the EUV light in the burst period is 100 kHz
(3) The duration of the intermission period is T2.

The output parameters of the EUV light may include other indexes, not limited to the above three indexes. For example, the output parameters may further include the number of bursts. In this case, the pattern number may be indicated using four or more digits.

The memory unit 51 stores the output parameters of the trajectory correcting laser beam 36 for each combination pattern of indexes of the output parameters of the EUV light.

As described with reference to FIG. 11, the output parameters of the trajectory correcting laser beam 36 include, for example, combinations of indexes described below.
(1) Output start timing Tsn for n-th burst period
(2) Output finish timing Ten for n-th burst period
(3) Beam intensity Isn at start of output for n-th burst period
(4) Beam intensity Ien at finish of output for n-th burst period

5.5 Effect

According to the third embodiment, the position of the droplet 27a can be controlled in accordance with the output parameter of the EUV light without detecting the position of the droplet 27a. Then, the trajectory can be corrected even before the position of the droplet 27a is shifted. Also, the position of the droplet 27a can be controlled even when the distance L is long from the position at which the droplet 27a is irradiated with the trajectory correcting laser beam 36 to the plasma generating region 25, or when the trajectory of the droplet 27a changes at a short time interval.

Figure 14:
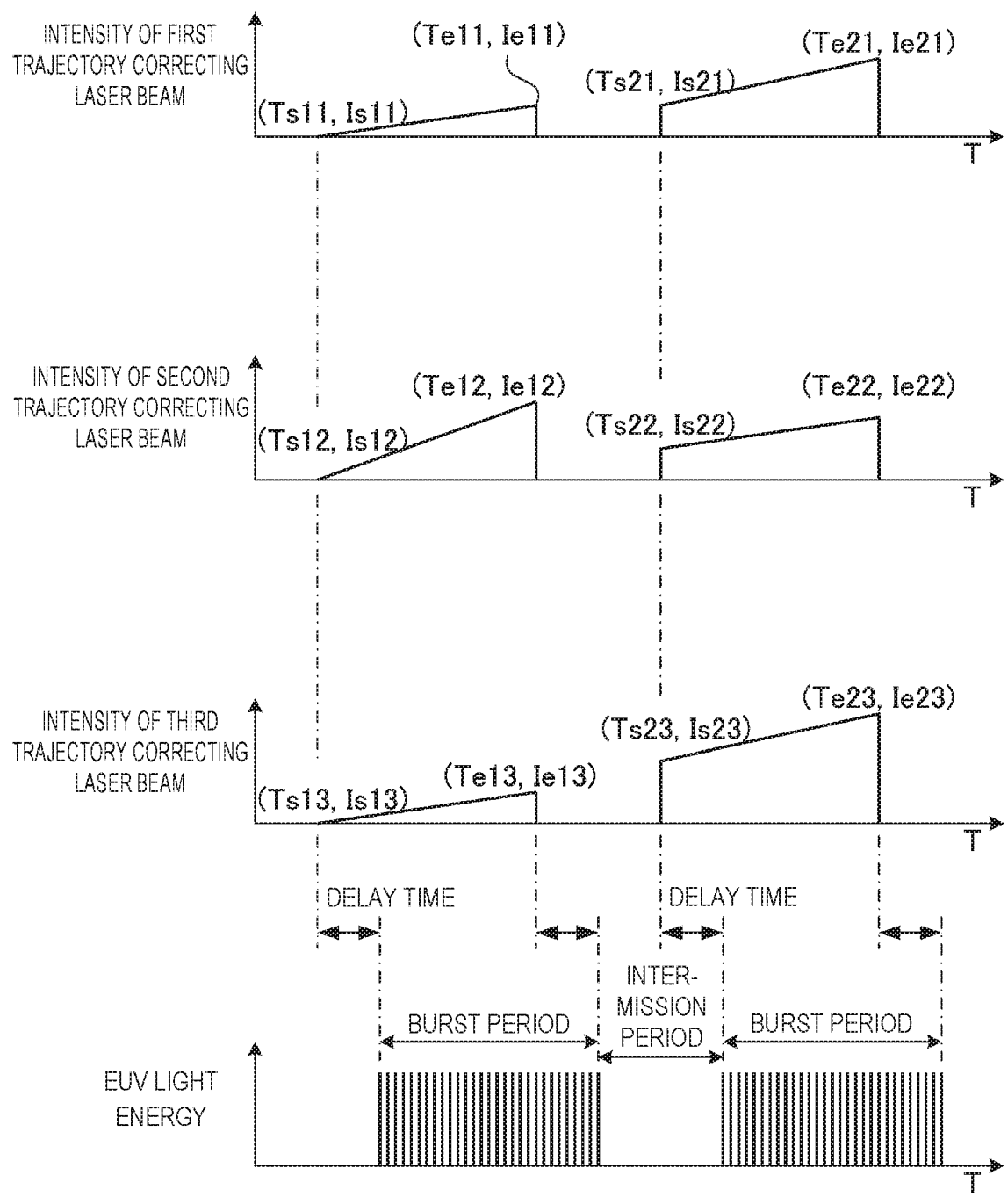
FIG. 14 shows exemplary set output parameters of a trajectory correcting laser beam in a variant of the third embodiment.

For other points, the third embodiment is the same as the first embodiment or the second embodiment. With reference to FIG. 14, a combination of the third embodiment and the second embodiment will be added.

5.6 Variant

FIG. 14 shows exemplary set output parameters of a trajectory correcting laser beam in a variant of the third embodiment. The variant of the third embodiment corresponds to a case in which the trajectory correcting laser apparatus 35 includes the first, second, and third trajectory correcting laser units 351, 352, 353 as in FIG. 8 in the third embodiment described with reference to FIG. 9. The variant of the third embodiment does not need to include the sensor units 401, 402.

In the variant of the third embodiment, output parameters are set for each of the trajectory correcting laser beams 36 output from the first, second, and third trajectory correcting laser units 351, 352, 353. The output parameters of the trajectory correcting laser beams 36 include, for example, combinations of indexes described below.
(1) Output start timing Tsnm of m-th trajectory correcting laser unit for n-th burst period
(2) Output finish timing Tenm of m-th trajectory correcting laser unit for n-th burst period
(3) Beam intensity Isnm at start of output of m-th trajectory correcting laser unit for n-th burst period
(4) Beam intensity Ienm at finish of output of m-th trajectory correcting laser unit for n-th burst period FIG. 14 shows output parameters of the trajectory correcting laser beams 36 from the first to third trajectory correcting laser units for the first burst period and the second burst period.

6. Others

Figure 15:
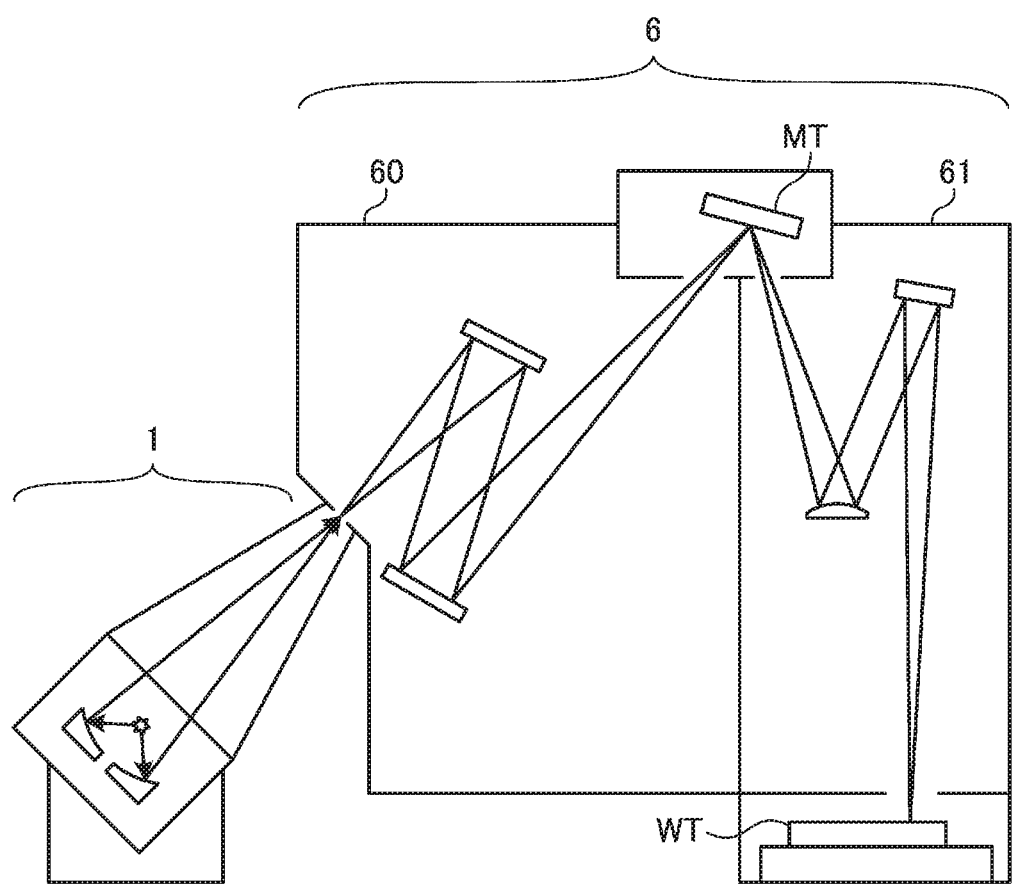
FIG. 15 schematically shows a configuration of an exposure apparatus connected to the EUV light generating apparatus.

FIG. 15 schematically shows a configuration of an exposure apparatus connected to the EUV light generating apparatus.

In FIG. 15, the exposure apparatus 6 includes a mask irradiating unit 60 and a workpiece irradiating unit 61. The mask irradiating unit 60 illuminates, with EUV light incident from the EUV light generating apparatus 1, a mask pattern on a mask table MT through a reflective optical system. The workpiece irradiating unit 61 forms an image of the EUV light reflected by the mask table MT on a workpiece (not shown) arranged on a workpiece table WT through a reflective optical system. The workpiece is a photosensitive substrate such as a semiconductor wafer coated with photoresist. The exposure apparatus 6 synchronously translates the mask table MT and the workpiece table WT to expose the EUV light reflecting the mask pattern onto the workpiece. Through an exposure process as described above, a device pattern is transferred onto the semiconductor wafer, thereby manufacturing an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:
1. An extreme ultraviolet light generating system comprising:
 a chamber;
 a target supply unit configured to successively output, toward a predetermined region in the chamber, a plurality of droplets including a first droplet and a second droplet of a target substance;
 a trajectory correcting laser apparatus configured to apply a trajectory correcting laser beam to each of the droplets moving from the target supply unit toward the predetermined region;
 a droplet position sensor configured to detect each droplet moving from the target supply unit toward the predetermined region;
 a drive laser apparatus configured to apply a drive laser beam to each droplet having reached the predetermined region to generate plasma; and
 a control unit configured to control the trajectory correcting laser apparatus such that intensity of the trajectory correcting laser beam applied to the first droplet is different from intensity of the trajectory correcting laser beam applied to the second droplet,
 wherein the control unit controls the trajectory correcting laser apparatus to change the intensity of the trajectory correcting laser beam in accordance with a position of each droplet detected by the droplet position sensor.

2. The extreme ultraviolet light generating system according to claim 1, wherein the trajectory correcting laser apparatus includes
a first trajectory correcting laser unit configured to apply, to each droplet, the trajectory correcting laser beam traveling in a first direction, and
a second trajectory correcting laser unit configured to apply, to each droplet, the trajectory correcting laser beam traveling in a second direction different from the first direction.

3. The extreme ultraviolet light generating system according to claim 1, wherein the trajectory correcting laser beam applied to each droplet by the trajectory correcting laser apparatus has a wavelength of 300 nm to 10 µm.

4. The extreme ultraviolet light generating system according to claim 1, wherein the intensity of the trajectory correcting laser beam applied to each droplet by the trajectory correcting laser apparatus changes in a range of $10^5$ W/cm$^2$ to $10^9$ W/cm$^2$.

5. The extreme ultraviolet light generating system according to claim 1, wherein a distance from the target supply unit to each droplet when the droplet is irradiated with the trajectory correcting laser beam is 2 mm or longer and is shorter than a distance from the target supply unit to the predetermined region.

6. The extreme ultraviolet light generating system according to claim 1, wherein the trajectory correcting laser apparatus includes a continuously oscillating laser.

7. The extreme ultraviolet light generating system according to claim 1, further comprising an optical system arranged on an optical path of the trajectory correcting laser beam, and configured to reduce variations in beam intensity distribution in a direction perpendicular to a moving direction of each droplet moving from the target supply unit toward the predetermined region.

8. The extreme ultraviolet light generating system according to claim 1, wherein the droplet position sensor is configured to detect a position of each droplet having been irradiated with the trajectory correcting laser beam.

9. The extreme ultraviolet light generating system according to claim 1, wherein the trajectory correcting laser apparatus is configured to apply, to each droplet, the trajectory correcting laser beam traveling in a first direction, and
the control unit compares, with a target position, the position of each droplet detected by the droplet position sensor, and controls the trajectory correcting laser apparatus to increase the intensity of the trajectory correcting laser beam when the position of each droplet is greatly shifted in a direction opposite to the first direction relative to the target position.

10. The extreme ultraviolet light generating system according to claim 1, wherein the trajectory correcting laser apparatus includes
a first trajectory correcting laser unit configured to apply, to each droplet, the trajectory correcting laser beam traveling in a first direction, and
a second trajectory correcting laser unit configured to apply, to each droplet, the trajectory correcting laser beam traveling in a second direction different from the first direction,
the control unit compares, with a target position, the position of each droplet detected by the droplet position sensor,
controls the trajectory correcting laser apparatus to increase the intensity of the trajectory correcting laser beam output from the first trajectory correcting laser unit to be higher than the intensity of the trajectory correcting laser beam output from the second trajectory correcting laser unit when the position of each droplet is shifted in a direction opposite to the first direction relative to the target position, and
controls the trajectory correcting laser apparatus to increase the intensity of the trajectory correcting laser beam output from the second trajectory correcting laser unit to be higher than the intensity of the trajectory correcting laser beam output from the first trajectory correcting laser unit when the position of each droplet is shifted in a direction opposite to the second direction relative to the target position.

11. An extreme ultraviolet light generating system comprising:
a chamber;
a target supply unit configured to successively output, toward a predetermined region in the chamber, a plurality of droplets including a first droplet and a second droplet of a target substance;
a trajectory correcting laser apparatus configured to apply a trajectory correcting laser beam to each of the droplets moving from the target supply unit toward the predetermined region;
a drive laser apparatus configured to apply a drive laser beam to each droplet having reached the predetermined region to generate plasma; and
a control unit configured to control the trajectory correcting laser apparatus such that intensity of the trajectory correcting laser beam applied to the first droplet is different from intensity of the trajectory correcting laser beam applied to the second droplet,
wherein the control unit controls the trajectory correcting laser apparatus to change the intensity of the trajectory correcting laser beam in accordance with an output parameter of extreme ultraviolet light.

12. The extreme ultraviolet light generating system according to claim 11, wherein the output parameter of the extreme ultraviolet light includes at least one of a target value of energy of the extreme ultraviolet light, a repetition frequency of the extreme ultraviolet light, and a duration of an intermission period of the extreme ultraviolet light.

13. The extreme ultraviolet light generating system according to claim 11, further comprising a memory unit storing a relationship between the output parameter of the extreme ultraviolet light and an output parameter of the trajectory correcting laser beam, wherein
the control unit reads the output parameter of the trajectory correcting laser beam from the memory unit in accordance with the output parameter of the extreme ultraviolet light, and controls the trajectory correcting laser apparatus in accordance with the output parameter of the trajectory correcting laser beam.

14. The extreme ultraviolet light generating system according to claim 13, wherein the output parameter of the trajectory correcting laser beam includes at least one of output start timing, output finish timing, beam intensity at a start of output, and beam intensity at a finish of output, of the trajectory correcting laser beam.

15. The extreme ultraviolet light generating system according to claim 11, wherein the output parameter of the extreme ultraviolet light is defined such that a burst period in which the extreme ultraviolet light is output at a predetermined repetition frequency and an intermission period in which the output of the extreme ultraviolet light at the predetermined repetition frequency is stopped are repeated, and the control unit starts output of the trajectory correcting laser beam at first timing earlier by a predetermined time than a start of the burst period.

16. The extreme ultraviolet light generating system according to claim 15, wherein the control unit finishes the output of the trajectory correcting laser beam at second timing earlier by the predetermined time than a finish of the burst period.

17. The extreme ultraviolet light generating system according to claim 16, wherein the control unit controls the trajectory correcting laser apparatus such that the intensity of the trajectory correcting laser beam is higher at third timing between the first timing and the second timing than at the first timing.

18. The extreme ultraviolet light generating system according to claim 17, wherein the control unit controls the trajectory correcting laser apparatus such that the intensity of the trajectory correcting laser beam is higher at the second timing than at the third timing.

19. An electronic device manufacturing method comprising:
   generating extreme ultraviolet light by applying a drive laser beam to a droplet with an extreme ultraviolet light generating system, the extreme ultraviolet light generating system including
   a chamber,
   a target supply unit configured to successively output, toward a predetermined region in the chamber, a plurality of droplets including a first droplet and a second droplet of a target substance,
   a trajectory correcting laser apparatus configured to apply a trajectory correcting laser beam to each of the droplets moving from the target supply unit toward the predetermined region,
   a droplet position sensor configured to detect each droplet moving from the target supply unit toward the predetermined region,
   a drive laser apparatus configured to apply a drive laser beam to each droplet having reached the predetermined region to generate plasma, and
   a control unit configured to control the trajectory correcting laser apparatus such that intensity of the trajectory correcting laser beam applied to the first droplet is different from intensity of the trajectory correcting laser beam applied to the second droplet,
   the control unit controlling the trajectory correcting laser apparatus to change the intensity of the trajectory correcting laser beam in accordance with a position of each droplet detected by the droplet position sensor;
   outputting the extreme ultraviolet light to an exposure apparatus; and
   exposing the extreme ultraviolet light onto a photosensitive substrate within the exposure apparatus to manufacture an electronic device.

* * * * *